(12) United States Patent
Dong et al.

(10) Patent No.: US 9,782,740 B2
(45) Date of Patent: Oct. 10, 2017

(54) CONTROL SYSTEM OF FULL-AUTOMATIC COLD PLASMA SEED PROCESSOR

(71) Applicants: Institute of Soil Science, Chinese Academy of Sciences, Jiangsu (CN); Changzhou Zhongke Changtai Plasma Technology Co., Ltd., Jiangsu (CN)

(72) Inventors: Yuanhua Dong, Jiangsu (CN); Hanliang Shao, Jiangsu (CN); Jiangang Li, Jiangsu (CN); Qin Miao, Jiangsu (CN)

(73) Assignees: Changzhou Zhongke Changtai Plasma Technology Co., Ltd., Jiangsu (CN); Institute of Soil Science, Chinese Academy of Sciences, Jiangsu (CN)

( * ) Notice: Subject to any disclaimer, the term of this patent is extended or adjusted under 35 U.S.C. 154(b) by 122 days.

(21) Appl. No.: 14/648,781

(22) PCT Filed: Mar. 28, 2013

(86) PCT No.: PCT/CN2013/073331
§ 371 (c)(1),
(2) Date: Jun. 1, 2015

(87) PCT Pub. No.: WO2014/086128
PCT Pub. Date: Jun. 12, 2014

(65) Prior Publication Data
US 2015/0298086 A1    Oct. 22, 2015

(30) Foreign Application Priority Data

Dec. 7, 2012    (CN) .......................... 2012 1 0521682

(51) Int. Cl.
*B01J 19/08* (2006.01)
*H01J 37/32* (2006.01)
(Continued)

(52) U.S. Cl.
CPC ............. *B01J 19/0006* (2013.01); *A01C 1/00* (2013.01); *B01J 19/088* (2013.01);
(Continued)

(58) Field of Classification Search
None
See application file for complete search history.

(56) References Cited

FOREIGN PATENT DOCUMENTS

| CN | 2807733 Y | 8/2006 |
|---|---|---|
| CN | 101669416 A | 3/2010 |

(Continued)

*Primary Examiner* — Kishor Mayekar
(74) *Attorney, Agent, or Firm* — Saliwanchik, Lloyd & Eisenschenk (57) ABSTRACT

A control system of a full-automatic cold plasma seed processor comprises a human-machine interaction interface, a PLC, a transport module, a vacuum degree module, an ionization module, and an energy supply module. The human-machine interaction interface is in a communications connection with the PLC by using a serial port. The energy supply module supplies a power source required by another module in a system. The PLC controls a transport rate of seeds by using the transport module, controls, by using the vacuum degree module, the vacuum degree of the system to reach a dynamic balance, and at last, controls the ionization time and the ionization power by using the ionization module, so as to adapt to processing requirements of different seeds and achieve an optimal processing effect. The control system can automatically process seeds of various grains, and brings short processing time and low cost.

12 Claims, 6 Drawing Sheets

(51) Int. Cl.
 *B01J 19/00* (2006.01)
 *A01C 1/00* (2006.01)
(52) U.S. Cl.
 CPC .. *H01J 37/32036* (2013.01); *H01J 37/32082* (2013.01); *H01J 37/32926* (2013.01); *B01J 2219/00049* (2013.01); *B01J 2219/00171* (2013.01); *B01J 2219/0801* (2013.01); *B01J 2219/0847* (2013.01)

(56) References Cited

FOREIGN PATENT DOCUMENTS

| | | |
|---|---|---|
| CN | 101797394 A | 8/2010 |
| EP | 2 423 944 A1 | 2/2012 |

# CONTROL SYSTEM OF FULL-AUTOMATIC COLD PLASMA SEED PROCESSOR

I. TECHNICAL FIELD

The present invention belongs to the cold plasma seed treatment field, and particularly relates to a control system of a cold plasma seed processor.

II. BACKGROUND ART

Cold plasma seed treatment technology is high and new technology that can significantly increase the agricultural yield, and has been listed in the "863" Program of the state. The plasma seed processors developed presently mainly simulate a partial plasma environment in deep space and create a local environment with light, electricity, magnetism, and active ions, in which seeds are treated, to speed up the transformation of plant enzymes, activate the vitality of the seeds, and increase the contents of soluble sugars and soluble proteins, has certain beneficial effects to the entire growing cycle of crop plants. However, seeds treated with such technology have limited time effectiveness, for example, wheat seeds treated with such a method can be preserved for 15 days only. That drawback constrains the large-scale application of the technology.

III. CONTENTS OF THE INVENTION

Technical Problem

A technical problem to be solved in the present invention is to provide a control system of a cold plasma seed processor, which is easy to operate, convenient to use, flexible and highly efficient, and can overcome the drawbacks in the prior art.

Technical Scheme

To solve the technical problem described above, the present invention employs the following technical scheme:

A control system of a full-automatic cold plasma seed processor, comprising a human-machine interaction interface, a Programmable Logic Controller (PLC), an energy supply module designed to supply operating power, a transport module designed to transport seeds to be treated, and a vacuum degree module composed of a vacuum gauge tube, a vacuum solenoid valve, and mechanical pumps, and
an ionization module composed of an ionization device, a Radio Frequency (RF) power source 11, and an automatic impedance matching device, wherein:

The human-machine interaction interface is in a communication connection with the PLC via a RS-232 interface, the human-machine interaction interface transmits the operating parameters corresponding to the seeds to be treated via the RS-232 interface to the Programmable Logic Controller (PLC), and the PLC controls the transport module, vacuum degree module, and ionization module according to the received data; the operating parameters include Number of Gas Displacements, Target Vacuum Degree, Ionization Time, Ionization Power, and Seed Transport Rate.

The process is as follows:

step A: arranging an enclosed chamber for cold plasma seed treatment, with a feeding inlet 51 having an air intake valve 52 and a discharging outlet 53 having a vent valve 54 arranged on the chamber respectively, and transporting seeds to be treated via the feeding inlet to the transport module arranged in the chamber;

step B: vacuum-pumping the chamber via the vent valve with a set of mechanical pumps 61 and 62, and detecting the vacuum degree in the chamber with the vacuum gauge tube at the same time, till the vacuum degree in the chamber reaches ultimate vacuum degree;

step C: filling a working gas into the chamber via the vacuum solenoid valve, till the pressure reaches 1,000 pa;

step D: judging whether the gas displacement is completed according to a preset number of gas displacements, if the gas displacement is not completed yet, repeating steps B~C, till the actual number of gas displacements is equal to the preset number of gas displacements;

step E: vacuum-pumping the chamber with the set of mechanical pumps 61 and 62 again, till the vacuum degree in the chamber reaches a preset target vacuum degree;

step F: controlling the RF power source with the PLC to output preset ionization power to the ionization device; and outputting a switch signal from the PLC to control the operating state of the RF power source; keeping track of the change of gas medium and density in the chamber with the automatic impedance matching device and matching the impedance automatically, so that the effective power output from the RF power source is equal to the preset power;

step G: controlling the vacuum gauge tube with the PLC to detect the vacuum degree in the chamber in real time, comparing the vacuum degree in the chamber with the preset target vacuum degree, and controlling the opening of the vacuum solenoid valve according to the comparison result to carry out Proportional-Integral-Derivative (PID) regulation, so that the vacuum degree in the chamber reaches a dynamic balance state ultimately;

step H: transporting the seeds to be treated with the transport module according to a preset transport rate to the ionization device and treating the seeds by ionization in the ionization device, till a preset ionization time in the system is reached; then, transporting the treated seeds to the discharging outlet, and stopping the operation of the ionization module and vacuum degree module; opening the air intake valve, and filling air into the chamber;

step J: terminating the operation when there is no pressure difference between the exterior and the interior of the chamber.

IV. BENEFITS

With the technical scheme described above, the present invention has the following technical effects and advantages comparing with the prior art:

The system disclosed in the present invention generates cold plasma when it operates. Through the energy interaction between the cold plasma and bio-macromolecules, the electrons in the bio-macromolecules transit from a lower-energy state (ground state) to a higher-energy state (excited state), as a result, the activities of various enzymes in the germinating seeds or seedlings, such as amylase, succinate dehydrogenase, peroxidase, and superoxide dismutase, etc., are significantly improved, the respiration of the seeds is enhanced, the vitality is boosted, the biological oxidation process is accelerated, and the substance transportation and synthesis ability is also accelerated. Macroscopically, the effect is represented by significantly improved germination ratio and germination power; in addition, the resistance of the agricultural crops against drought, cold, and diseases and insect pests is enhanced, the use of chemical fertilizers and pesticides can be reduced, and the agricultural yield can be increased.

In the present invention, the cold plasma seed processor is controlled automatically by the PLC. As a result, the time effectiveness of treated wheat can be prolonged to at least 3 months, and the yield increasing effect is more obvious. In addition, the standardization and commercialization of the cold plasma seed treatment technology becomes possible, and the control system disclosed in the present invention has an important boosting effect for meeting the demand for food in China caused by the industrial development and reduced cultivable lands and solving the "three agriculture-related issues" that hinders the full attainment of the "relatively comfortable living standard" goal in China.

Among the figures: 1—insulated support, 2—ionization device, 3—driving roller, 4—driven roller, 5—press roller, 6—conveying belt, 2-1—upper pole plate, 2-2—upper pole plate connector, 2-3—lower pole plate, 2-4—lower pole plate connector, 2-5—ionization chamber, 7—pole plate, 8—metal float shielding enclosure, 9—insulating material, 10—pole plate connector, 11—Radio Frequency (RF) power source, 12—AC power, 13—transformer, 14—load.

VI. EMBODIMENTS

Hereunder the technical scheme of the present invention will be further detailed, with reference to the accompanying drawings.

Figure 1:
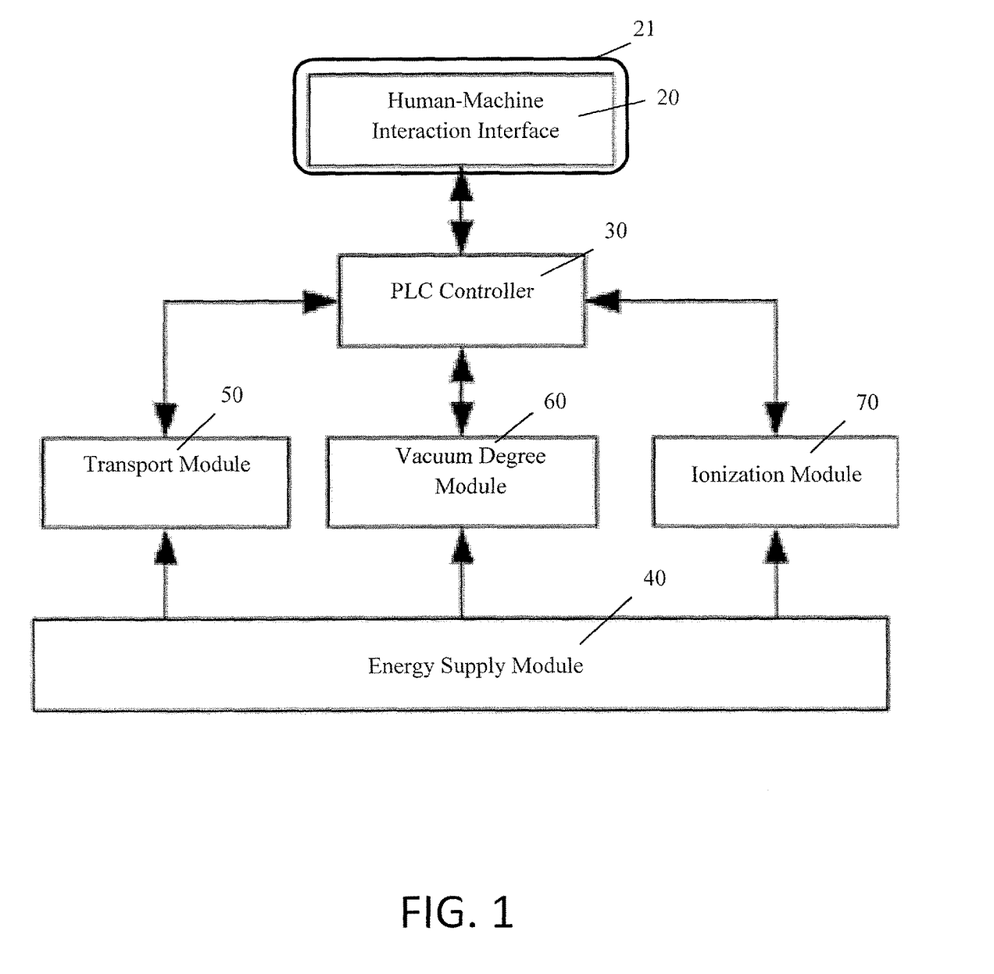
FIG. 1 is a structural block diagram of the system in the present invention.

As shown in FIG. 1, the system structure in the present invention comprises a human-machine interaction interface 20, a PLC 30, a transport module 50, a vacuum degree module 60, an ionization module 70, and an energy supply module 40. The human-machine interaction interface is in a communication connection with the PLC via a serial port, the energy supply module provides power required by other modules in the system, the PLC controls the seed transport rate via the transport module, controls the vacuum degree in the system to reach dynamic balance via the vacuum degree module, and finally control the ionization time and ionization power via the ionization module to adapt to the treatment requirements of different seeds and achieve an optimal treatment effect.

Wherein, the human-machine interaction interface 20 is in a communication connection with the PLC via a RS-232 interface 80 to transmit operating parameters via the RS-232 interface to the PLC, the PLC 30 controls the transport module 50, vacuum degree module 60, and ionization module 70 according to the received data, and the operating states of the transport module, vacuum degree module, and ionization module are monitored in real time on the human-machine interaction interface 20 by means of RS-232 80 communication. The energy supply module supplies operating power to the human-machine interaction interface, PLC, transport module, vacuum degree module, and ionization module.

Figure 2:
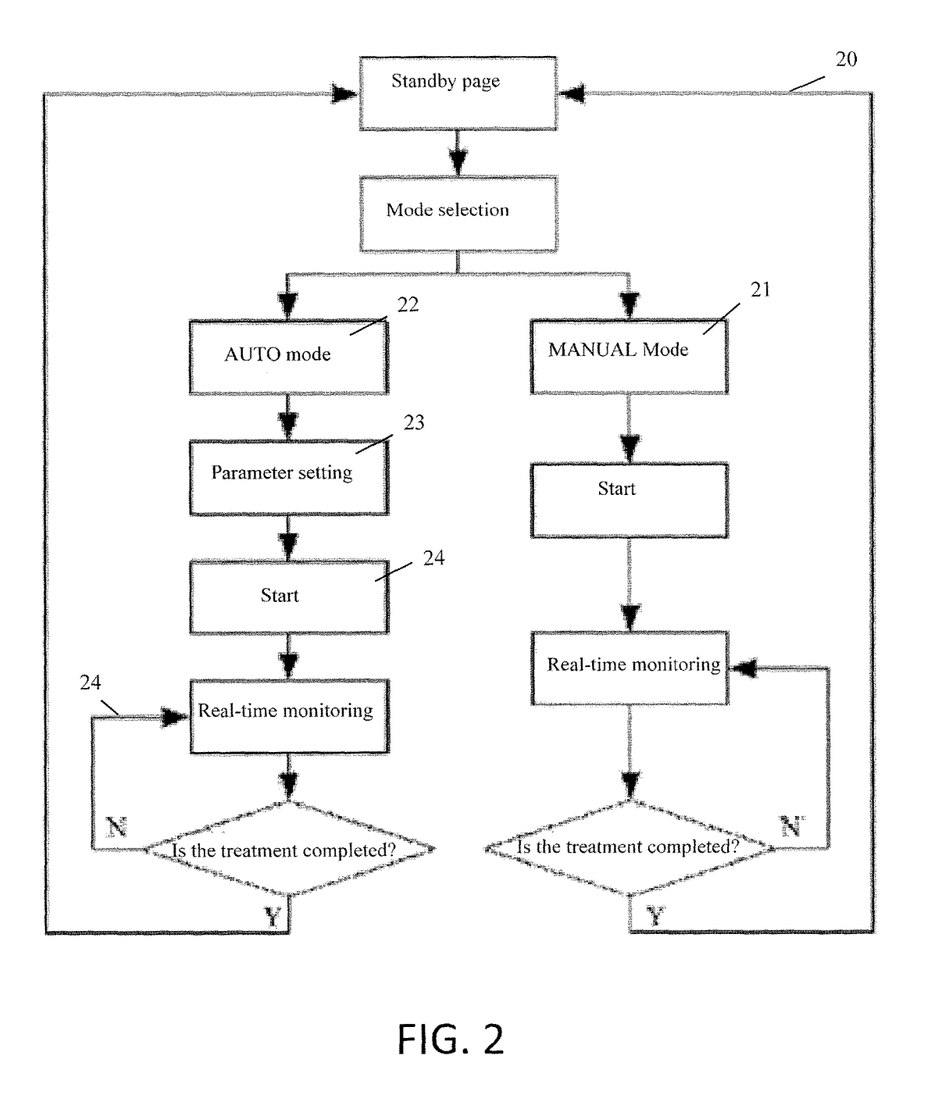
FIG. 2 is a framework block diagram of the human-machine interaction interface in the present invention.

As shown in FIG. 2, the human-machine interaction interface consists of standby page, mode selection page, and real-time monitoring page; two operating modes (MANUAL and AUTO) can be selected on the mode selection page. The human-machine interaction interface shows the standby page when the system is in standby mode. The user can click on the standby page to activate the system and enter into the mode selection page, which provides two modes (MANUAL 21 and AUTO 22) for selection. When AUTO mode is selected, the user can enter into the parameter setting page 23 and set target vacuum degree, ionization time, ionization power, number of gas displacements, and transport rate. After the parameter setting, the user can click on Start 24; then, the system enters into automatic treatment state. In that state, the user can monitor the operating state of the system in real time on the human-machine interaction interface, which is in a communication with the PLC 30 by means of RS-232. If MANUAL control is selected, the user can control the operating states of two mechanical pumps, the opening of the vacuum solenoid valve 90, the discharge power, the discharge time, and the transport rate, the operation is more flexible, the system employs a Chinese operating interface, to probe the seed treatment process in the early stage.

Figure 3:
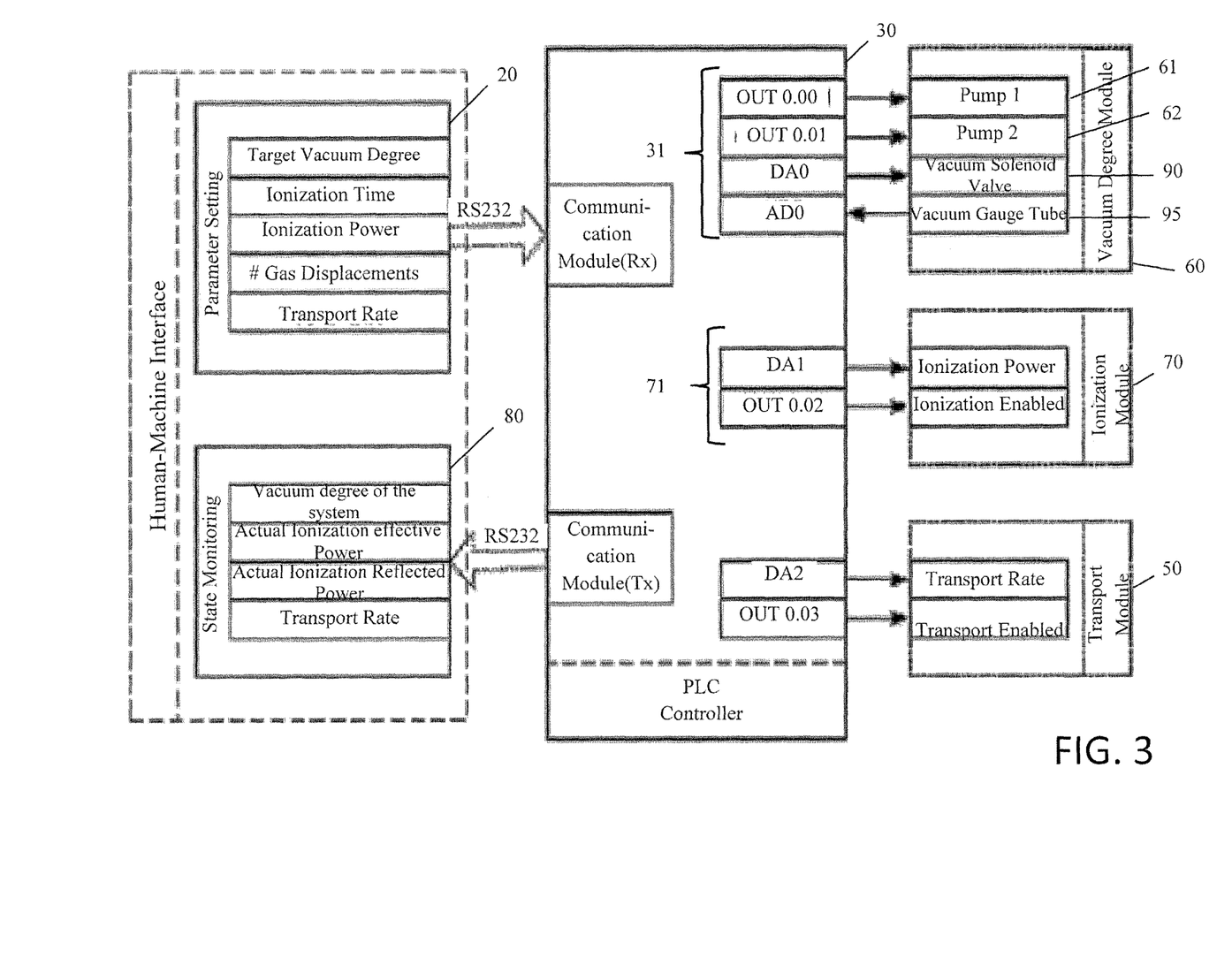
FIG. 3 is a schematic electrical diagram of the present invention.

As shown in FIG. 3, the control system comprises a PLC, a communication module, a vacuum degree module, an ionization module, and a transport module. Wherein, the communication module is mainly designed to communicate with the human-machine interaction interface by means of RS-232 communication.

The vacuum degree module mainly comprises a vacuum gauge tube 95, a vacuum solenoid valve 90, and mechanical pumps 61 and 62. Wherein, the vacuum solenoid valve is designed to fill gas; the mechanical pumps are designed to pump gas, and include pump 1 61 and pump 2 62, which are connected to switch output ports of the PLC, so that the operating states of the pumps can be controlled; the vacuum gauge tube is designed to detect the vacuum degree in the chamber and feed back a 0-5V analog signal, which corresponds to 0-1,000 pa vacuum degree; the PLC compares the above vacuum degree with a preset target vacuum degree and carries out PID regulation 31 accordingly, and outputs a 0-5V analog signal to control the opening of the vacuum solenoid valve, so that the vacuum degree in the chamber reaches dynamic balance ultimately.

The ionization module mainly comprises an ionization device, a RF power source, and an automatic impedance matching device; the PLC controls the ionization device to output 0-10V voltage to control the ionization power, which corresponds to 0-500 w power; at the same time, the PLCoutputs a switch signal to control the operating state of the RF power source. As the gas medium and density in the chamber changes, the automatic impedance matching device keeps track of the change of the gas medium and density and match automatically, to provide appropriate impedance, so that the effective power is almostly equal to the preset power, and thereby the treatment effect is ensured.

The transport module mainly comprises a transport device, a frequency converter, a reducer, and an AC motor;

the PLC outputs 4-20 mA current to control the transport rate of the transport device, and output a switching value to control the operating state of the transport device. Thus, appropriate transport rates can be set for different seed treatment processes, and the operation is simple and convenient.

Figure 5:
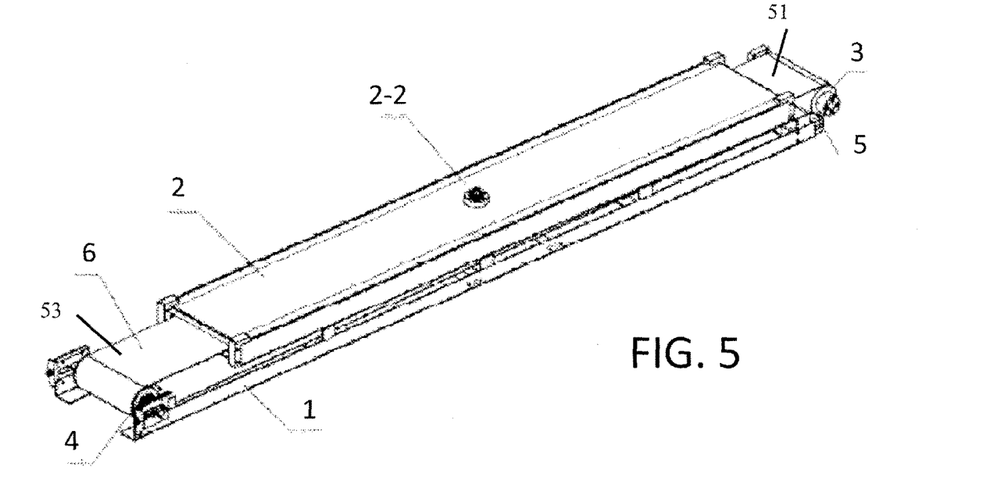
FIG. 5 is an overall schematic structural diagram of the transport device.

As shown in FIG. 5, the transport device mainly comprises an insulated support 1, an ionization device 2, a driving roller 3, a driven roller 4, a press roller 5, and a conveying belt 6, wherein, the insulated support is made of bent and welded stainless steel plates, and is coated with an insulating material; two pole plates are fixed in parallel on the insulated support; the driving roller, driven roller, and press roller are mounted to the insulated support via bearing seats, and can rotate smoothly; the conveying belt is wound over the driving roller and driven roller, and the press roller press the conveying belt against the driving roller to prevent the conveying belt from slipping during operation.

Wherein, the roller cores of the driving roller 3, driven roller 4, and press roller 5 are made of stainless steel, and coated with insulating rubber layers. The conveying belt 6 is made of a natural polymer material, such as cotton, hemp, flax or silk fabric, so that a strong electric field can be created.

Figure 6:
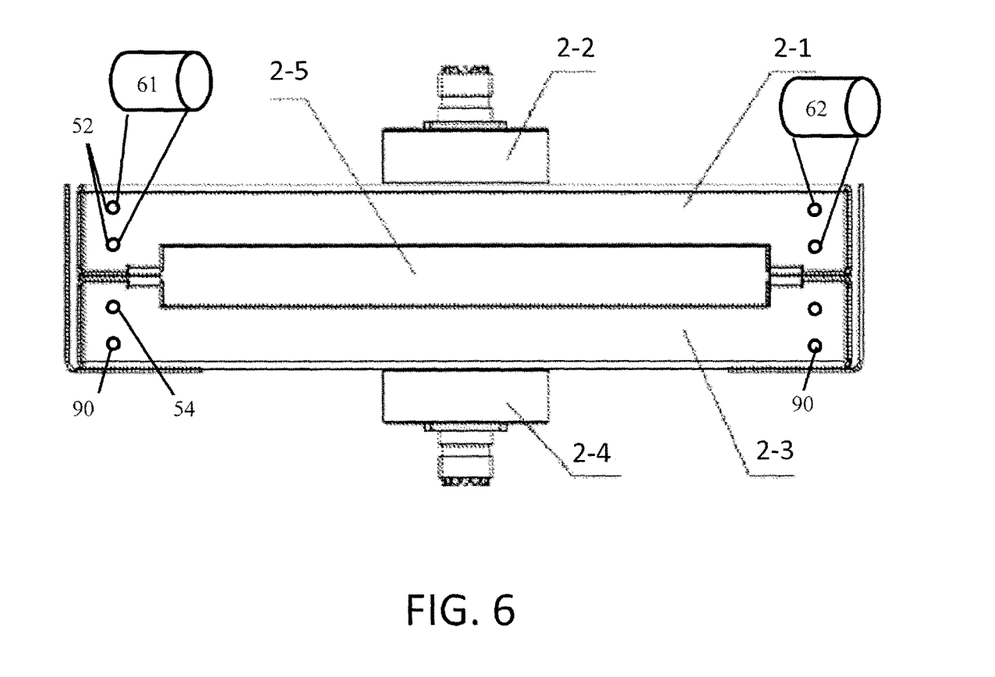
FIG. 6 is a schematic layout diagram of the ionization device.

As shown in FIG. 6, the upper pole plate 2-1 and lower pole plate 2-3 are arranged in parallel and opposite to each other, and the conveying belt pass through an ionization chamber 2-5 between the upper pole plate 2-1 and lower pole plate 2-3, each of the two pole plates has a pole plate connector, for connecting to the RF power source via RF output wires. The chamber contains a working gas, which can be a mixture of one or more of air, argon, oxygen, helium, and nitrogen.

Figure 7:
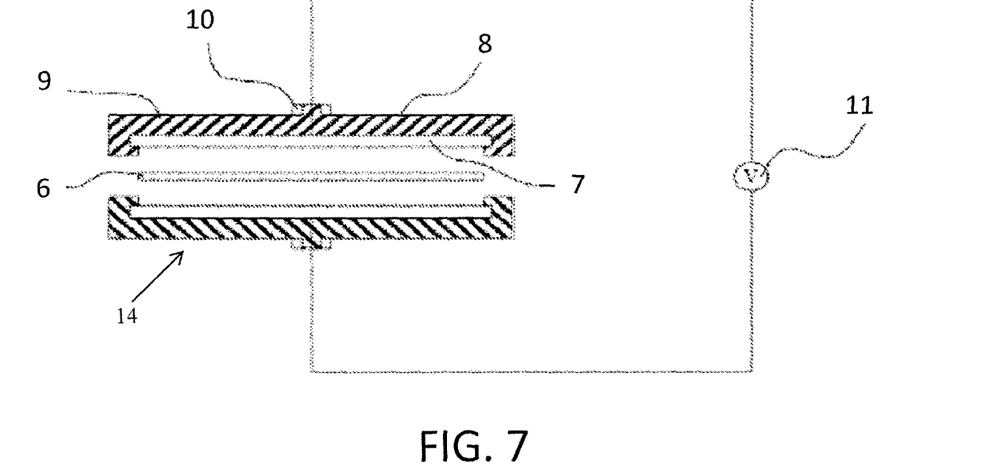
FIG. 7 is a schematic structural diagram of the ionization device.

As shown in FIG. 7, the conveying belt passes through the ionization device; the ionization device 2 comprises two stainless steel pole plate 7 arranged in parallel to each other, each of which are semi-enclosed by a metal float shielding enclosure 8 made of stainless steel. As shown in FIG. 6 and FIG. 7, the semi-enclosing structure is arranged in a way that only the opposite surfaces of the two pole plates are exposed. The space between the pole plates and the metal float shielding enclosure is filled with Teflon, ceramics or propylene, and there is no clearance between the filler and the pole plates and between the filler and the enclosure, and the spacing between the opposite surfaces of the two pole plates is 1.5-10 cm; the conveying belt pass through the space between the two pole plates; each of the two pole plates has a pole plate connector 10, which is connected to the RF power source via RF output wires. An insulating material is provided at the joint between the pole plate connector 10 and the pole plate, to prevent the joint from electrical leakage. The upper and lower pole plates of the device are connected to a 13.56 MHz double-output RF power source, so as to produce homogeneous and steady plasma between the pole plates, for example, a gas mixed from argon and hydrogen (at 1:3 volume ratio) is used as the working gas, when glow discharge is carried out in a low vacuum state, the energy of the active particles produced can be as high as 1~20 ev.

Figure 8:
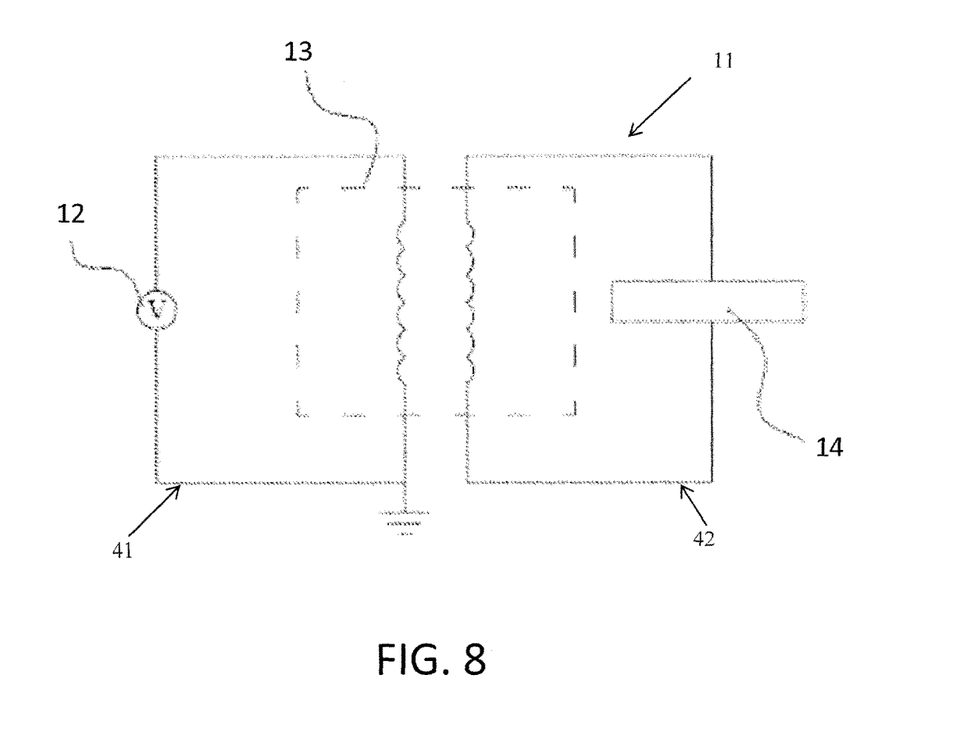
FIG. 8 is a schematic circuit diagram of the RF power source in the present invention.

As shown in FIG. 8, the RF power source is a double-output power supply unit, comprising a AC power 12 and a transformer 13; in the transformer, only the primary side 41 is grounded, after insulation-protected, the output terminal of the secondary side 42 is connected to the ionization device 2. The working principle of double outputs is similar to the working principle of a conventional transformer, in which the primary side and secondary side are common-grounded for signal or energy transmission stability and anti-interference. However, in actual practice, since the imbalance in the RF electric field resulted from common-grounding of the primary side and secondary side can't be eliminated, self-bias will occur inevitably, resulting in ion bombardment in a direct current field, and conduction current will flow through the two pole plates inevitably. In view of that, in the present invention, the common-grounding link is canceled, and a double-output interface is utilized, and the power output from the interface is constant, and has no impact under atmospheric pressure. The shielding protection still employs a grounding approach. The only difference is: the shielding protection for the double outputs in the vacuum chamber is in float state, including the metal float shielding for the pole plates. Thus, electrical discharge can happen only between the two pole plates, and thereby the generation of displacement current is ensured.

Figure 4:
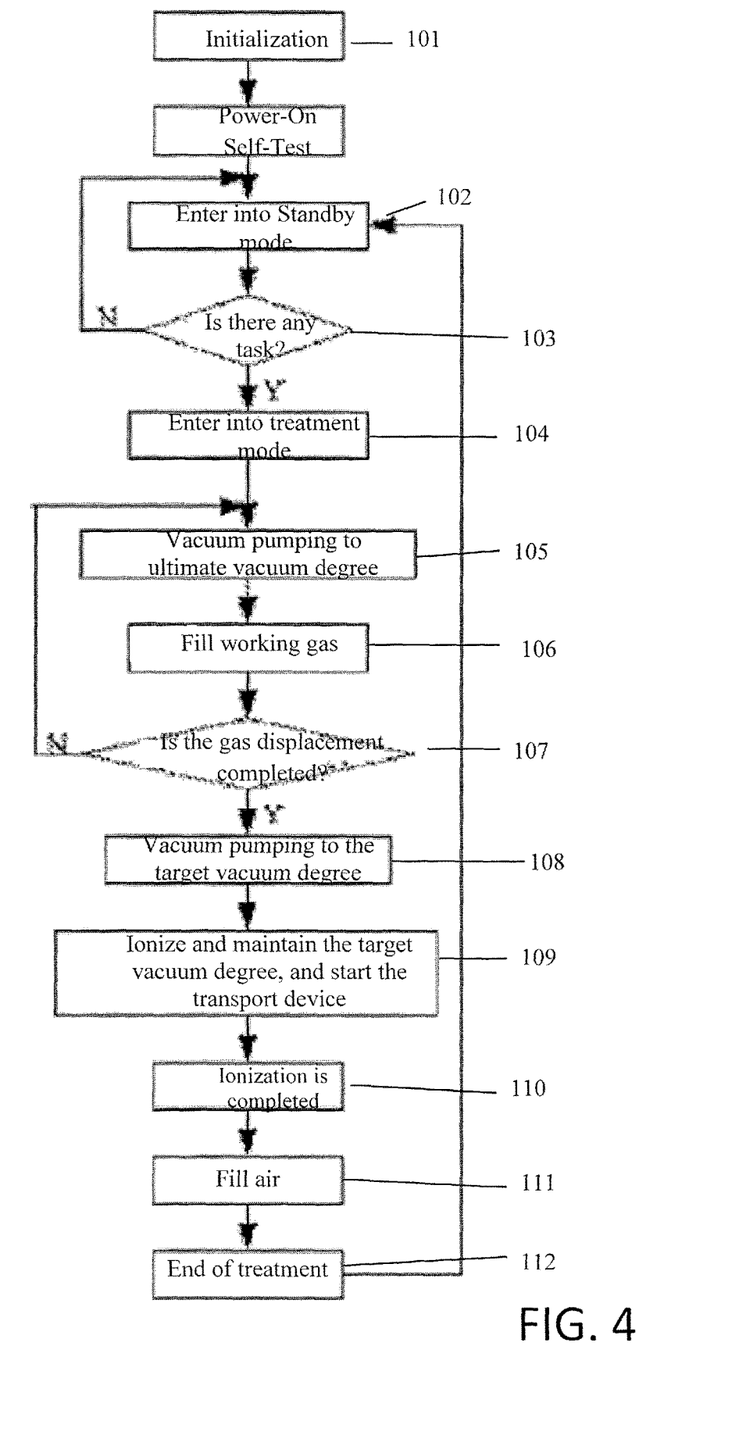
FIG. 4 is a software flow chart of the controller in the present invention.

As shown in FIG. 4, after power-on, the operating procedures and process of the system in the present invention are as follows:

Step 101: the system initializes and carries out power-on self-test, to ensure fault-free operation;

Step 102: the system enters into standby mode automatically and waits for a task;

Step 103: the system judges whether there is a task; if a task comes, the system will proceed to step 104; otherwise the system will return to step 102;

Step 104: the system enters into AUTO mode, as follows:

Step 105: the system starts vacuum-pumping the chamber by means of the mechanical pumps, and detects the vacuum degree in the chamber via the vacuum gauge tube at the same time, till the vacuum degree in the chamber reaches ultimate vacuum degree;

Step 106: a working gas is filled into the chamber via the vacuum solenoid valve, till the pressure reaches 1,000 pa;

Step 107: the system judges whether the gas displacement is completed according to a preset number of gas displacements, if the gas displacement is not completed yet, the system will repeat steps 105~106, till the actual number of gas displacements is equal to the preset number of gas displacements;

Step 108: the system executes vacuum-pumping for the chamber with the mechanical pumps, till the vacuum degree in the chamber reaches a preset target vacuum degree;

Step 109: the system starts the RF power source according to a preset ionization power and keeps the vacuum degree in the chamber in a dynamic balance state, and controls the transport device according to a preset transport rate;

Step 110: the system stops the operation of the ionization module and vacuum degree module when a preset ionization time in the system is reached;

Step 111: the air intake valve is opened, and air is filled into the system;

Step 112: the operation is terminated when there is no pressure difference between the exterior and the interior of the chamber, and the execution returns to step 102.

In the present invention, the pole plate structure in the ionization device is improved to add a metal float shielding enclosure and an insulating filling material, so as to prevent from electrical discharge between the pole plates and the inner wall of the chamber and generate displacement current, improve the plasma activity, and realize float shielding. Different from the prior art that involves conduction current, the structure in the present invention avoids electric current passing between the pole plates and the chamber and thereby avoids heat generation thereof. Hence, the temperature in the device can be controlled within a low temperature range without any additional cooling medium or structure, and the energy density of vacuum ultraviolet light is increased at the same time. By adjusting the spacing between the pole plates, appropriate photon density of vacuum ultraviolet light can be obtained. Different from existing plasma generator devices that utilize atmospheric pressure glow discharge, corona discharge, dielectric barrier discharge (DBD), Jacog's ladder discharge, or glide arc discharge, etc., a cold plasma glow discharge generator generates active particles with higher energy in a low vacuum state, for example, in a case that a gas mixed from argon and hydrogen (at 1:3 volume ratio) is used as the medium for glow discharge in a low vacuum state, the energy of the active particles generated is as high as 1~20 ev, which is at the same energy level as the electrons in bio-macromolecules, thus, the interaction between cold plasma and bio-macromolecules becomes possible, and that feature is incomparable and irreplaceable by other ionization devices in the art. In addition, a conveying belt is arranged in the ionization device between the two parallel pole plates, and the material can be transported continuously on the conveying belt. Thus, the degree of automation of the plasma processor is further improved, and thereby the treatment efficiency is improved, and it is possible to treat materials by industrial production, the present invention brings a wide developing space for the cold plasma treatment industry.

It should be appreciated that the embodiments described above are only provided to interpret the present invention but don't constitute any limitation to the present invention. Any alternation or modification made without departing from the spirit of the present invention shall be deemed as falling into the protected domain of the present invention.

The invention claimed is:

1. A cold-plasma glow-discharge generating device, adapted for treating seeds, comprising:
    a transport module comprising:
        an upper pole plate with a first side and a second side with a float shield enclosure thereon with a filler material between the float shield enclosure and the second side;
        a lower pole plate with a first side and a second side with a float shield enclosure thereon with a filler material between the float shield enclosure and the second side, where the first side of the upper pole plate is arranged parallel and facing the first side of the lower pole plate by a distance;
        an enclosed ionization chamber between the first side of the upper pole plate and the first side of the second pole plate, where the ionization chamber has a feeding inlet at one end and a discharge outlet at an opposite end; and
        a conveying belt operably arranged parallel with the upper pole plate and the lower pole plate such that the conveying belt rotates through the feeding inlet into the ionization chamber and subsequently exits through the discharge outlet;
    a vacuum degree module comprising:
        a first pump and a second pump operably connected to the ionization chamber for vacuum pumping the ionization chamber to a target vacuum degree; and
        a vacuum solenoid valve operably connected to the ionization chamber for filling the ionization chamber with a working gas after the ionization chamber has been vacuum pumped;
    an ionization module comprising:
        an upper pole plate connector operably connected to the upper pole plate,
        a lower pole plate connector operably connected to the lower pole plate;
        a radio-frequency power source operably connected to the upper pole plate connector and the lower pole plate connector for generating a cold plasma glow discharge in the ionization chamber by ionizing the working gas in the ionization chamber; and
        an automatic impedance matching device, operably connected to the radio-frequency power source, that utilizes Proportional-Integral-Derivative control for monitoring conditions in the ionization chamber;
    a programmable logic controller operably connected to the transport module, the vacuum module and the ionization module, such that fluctuating target vacuum degree conditions in the ionization chamber are detected by the automatic impedance matching device, which relays information to the programmable logic controller to operate the first pump and the second pump to stabilize the target vacuum degree; and
    a human-machine interface system operably connected to the programmable logic controller, where the interface system comprises:
        at least one screen for inputting instructions that control the programmable logic controller, wherein the instructions determine operating parameters by which the programmable logic controller will control the transport module, vacuum module, and ionization module.

2. The cold-plasma generating device, according to claim 1, wherein the conditions monitored by the automatic impedance matching device include a change in gas medium and a change in gas density within the ionization chamber.

3. The cold-plasma generating device, according to claim 2, wherein the radio-frequency power source is a double-output power supply unit having a grounded primary side and an ungrounded secondary side and further wherein the secondary side is connected to the upper pole plate connector and the lower pole plate connector.

4. The cold-plasma generating device, according to claim 1, wherein the distance between the first side of the upper pole plate and the first side of the lower pole plate is between approximately 1.5 cm and approximately 10 cm.

5. The cold-plasma generating device, according to claim 1, wherein the conveying belt comprises a natural polymer material.

6. The cold-plasma generating device, according to claim 5, wherein the natural polymer material is at least one of cotton, hemp, flax, or silk.

7. The cold-plasma generating device, according to claim 4, further comprising a vacuum gauge tube for measuring an amount of vacuum within the ionization chamber.

8. The cold-plasma generating device, according to claim 7, wherein the first pump and the second pump vacuum pump the ionization chamber until the vacuum gauge tube indicates the target vacuum degree.

9. The cold-plasma generating device, according to claim 8, wherein the vacuum solenoid valve fills the ionization chamber with the working gas to a pressure of approximately 1,000 Pascals.

10. The cold-plasma generating device, according to claim 1, wherein the human-machine interface system includes a screen for setting an automatic or manual operating mode.

11. A method for generating cold-plasma glow discharge, adapted to treat seeds, comprising:
    a. obtaining a cold-plasma generating device, according to claim 1, b. utilizing the first pump and the second pump to vacuum pump the ionization chamber until the target vacuum degree is obtained;
c. utilizing the vacuum solenoid valve to fill the ionization chamber with the working gas;
d. repeating steps b. and c. until the working gas has been displaced a present number of times;
e. activating the first pump and the second pump to vacuum pump the ionization chamber to the target vacuum degree;
f. activating the radio-frequency power source with the programmable logic controller to generate cold plasma glow discharge as the working gas fills the ionization chamber;
g. monitoring conditions in the ionization chamber utilizing the automatic impedance matching device;
h. transmitting information pertaining to the conditions in the ionization chamber to the programmable logic controller with the automatic impedance matching device;
i. utilizing the programmable logic controller to cause the first pump and the second pump to vacuum pump the ionization chamber to maintain the target vacuum degree;
j. stopping operation of the radio-frequency power source after a pre-determined amount of time; and
k. opening an air intake valve to fill the ionization chamber with ambient air.

12. The method, according to claim 11, further comprising:
transporting a plurality of seeds on the conveying belt through the feeding inlet and into ionization chamber prior to activating the radio-frequency power source;
allowing the plurality of seeds to remain in the ionization chamber during the pre-determined amount of time that the radio frequency power source operates; and
transporting the plurality of seeds out of the discharge outlet after the ionization chamber fills with ambient air.

* * * * *